United States Patent
Huang et al.

(10) Patent No.: US 12,300,635 B2
(45) Date of Patent: May 13, 2025

(54) SEMICONDUCTOR DEVICE HAVING FUNCTIONAL PATTERNS IN REDUNDANT REGIONS OF DOUBLE SEAL RING

(71) Applicant: Taiwan Semiconductor Manufacturing Company, Ltd., Hsinchu (TW)

(72) Inventors: Shan-Yu Huang, Zhubei (TW); Yilun Chen, Hsinchu (TW); Huang-Sheng Lin, Hsin-Chu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 333 days.

(21) Appl. No.: 17/711,847

(22) Filed: Apr. 1, 2022

(65) Prior Publication Data
US 2023/0317638 A1    Oct. 5, 2023

(51) Int. Cl.
*H01L 23/58* (2006.01)
*H01L 23/00* (2006.01)

(52) U.S. Cl.
CPC .......... *H01L 23/585* (2013.01); *H01L 23/562* (2013.01)

(58) Field of Classification Search
CPC ........................... H01L 23/585; H01L 23/562
See application file for complete search history.

(56) References Cited

U.S. PATENT DOCUMENTS

| | | | |
|---|---|---|---|
| 7,235,864 B2 | 6/2007 | Lee | |
| 8,022,550 B2 | 9/2011 | Koubuchi et al. | |
| 8,253,217 B2 | 8/2012 | Chen et al. | |
| 8,334,582 B2 | 12/2012 | Jeng et al. | |
| 8,395,239 B2 | 3/2013 | Chen et al. | |
| 8,461,021 B2 | 6/2013 | Yaung et al. | |
| 8,530,997 B1 | 9/2013 | Yang et al. | |
| 8,835,323 B1 | 9/2014 | Shieh et al. | |
| 9,093,308 B2 | 7/2015 | Yang et al. | |
| 9,245,842 B2 | 1/2016 | Chen et al. | |
| 9,377,680 B2 | 6/2016 | Chen et al. | |
| 9,437,739 B2 | 9/2016 | Yu et al. | |

(Continued)

FOREIGN PATENT DOCUMENTS

| | | |
|---|---|---|
| TW | 201250955 A | 12/2012 |
| TW | 201824462 A | 7/2018 |

OTHER PUBLICATIONS

Shan-Yu-Huang et al., Dummy Patterns in Redundant Region of Double Seal Ring, U.S. Appl. No. 17/336,977, filed Jun. 2, 2021, Assignee: Taiwan Semiconductor Manufacturing Company, Ltd., 24 pages of specification, 8 pages of drawings.

*Primary Examiner* — Peniel M Gumedzoe
(74) *Attorney, Agent, or Firm* — HAYNES AND BOONE, LLP

(57) ABSTRACT

A semiconductor structure includes a first circuit region; a first inner seal ring at least partially surrounding the first circuit region; and an outer seal ring at least partially surrounding the first inner seal ring. The outer seal ring includes a first corner and a substantially triangular corner seal ring (CSR) structure at the first corner. The first inner seal ring includes a second corner adjacent to and spaced away from the CSR structure. The semiconductor structure further includes a first region between a first side of the first corner and a first side of the second corner that is parallel to the first side of the first corner, and multiple functional patterns in the first region.

20 Claims, 9 Drawing Sheets

(56) References Cited

U.S. PATENT DOCUMENTS

| | | |
|---|---|---|
| 9,443,838 B2 | 9/2016 | Yang et al. |
| 9,946,827 B2 | 4/2018 | Wang et al. |
| 9,995,998 B2 | 6/2018 | Chen et al. |
| 10,229,889 B2 | 3/2019 | Tatour et al. |
| 10,304,781 B2* | 5/2019 | Baek ................ H01L 22/34 |
| 10,366,956 B2 | 7/2019 | Yang et al. |
| 10,373,865 B2 | 8/2019 | Yang et al. |
| 2005/0194649 A1* | 9/2005 | Oki ................ H01L 22/14 |
| | | 257/409 |
| 2005/0263855 A1 | 12/2005 | Fu et al. |
| 2011/0193198 A1* | 8/2011 | Chen ................ H01L 23/585 |
| | | 257/773 |
| 2012/0012843 A1 | 1/2012 | Matsubara |
| 2014/0035106 A1 | 2/2014 | Vu et al. |
| 2014/0327115 A1 | 11/2014 | Vu et al. |
| 2018/0122751 A1 | 5/2018 | Chen et al. |
| 2018/0122754 A1* | 5/2018 | Tatour ................ H01L 23/585 |
| 2019/0164911 A1* | 5/2019 | Pan ................ H01L 21/765 |
| 2022/0051993 A1 | 2/2022 | Chen |

\* cited by examiner

SEMICONDUCTOR DEVICE HAVING FUNCTIONAL PATTERNS IN REDUNDANT REGIONS OF DOUBLE SEAL RING

BACKGROUND

In semiconductor technologies, a semiconductor wafer is processed through various fabrication steps to form integrated circuits (IC). Typically, several circuits or IC dies are formed onto the same semiconductor wafer. The wafer is then diced to cut out the circuits formed thereon. To protect the circuits from moisture degradation, ionic contamination, and dicing processes, a seal ring is formed around each IC die. This seal ring is formed during fabrication of the many layers that comprise the circuits, including both the front-end-of-line (FEOL) processing and back-end-of-line processing (BEOL). The FEOL includes forming transistors, capacitors, diodes, and/or resistors onto the semiconductor substrate. The BEOL includes forming metal layer interconnects and vias that provide routing to the components of the FEOL.

Although existing seal ring structures and fabrication methods have been generally adequate for their intended purposes, improvements are desired. For example, it is desirable to form certain seal rings to be fully closed or partially closed depending on chip architecture by utilizing a double seal ring with an outer seal ring and multiple inner seal rings. It is also desirable to fully utilize the space between the outer seal ring and the inner seal rings.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
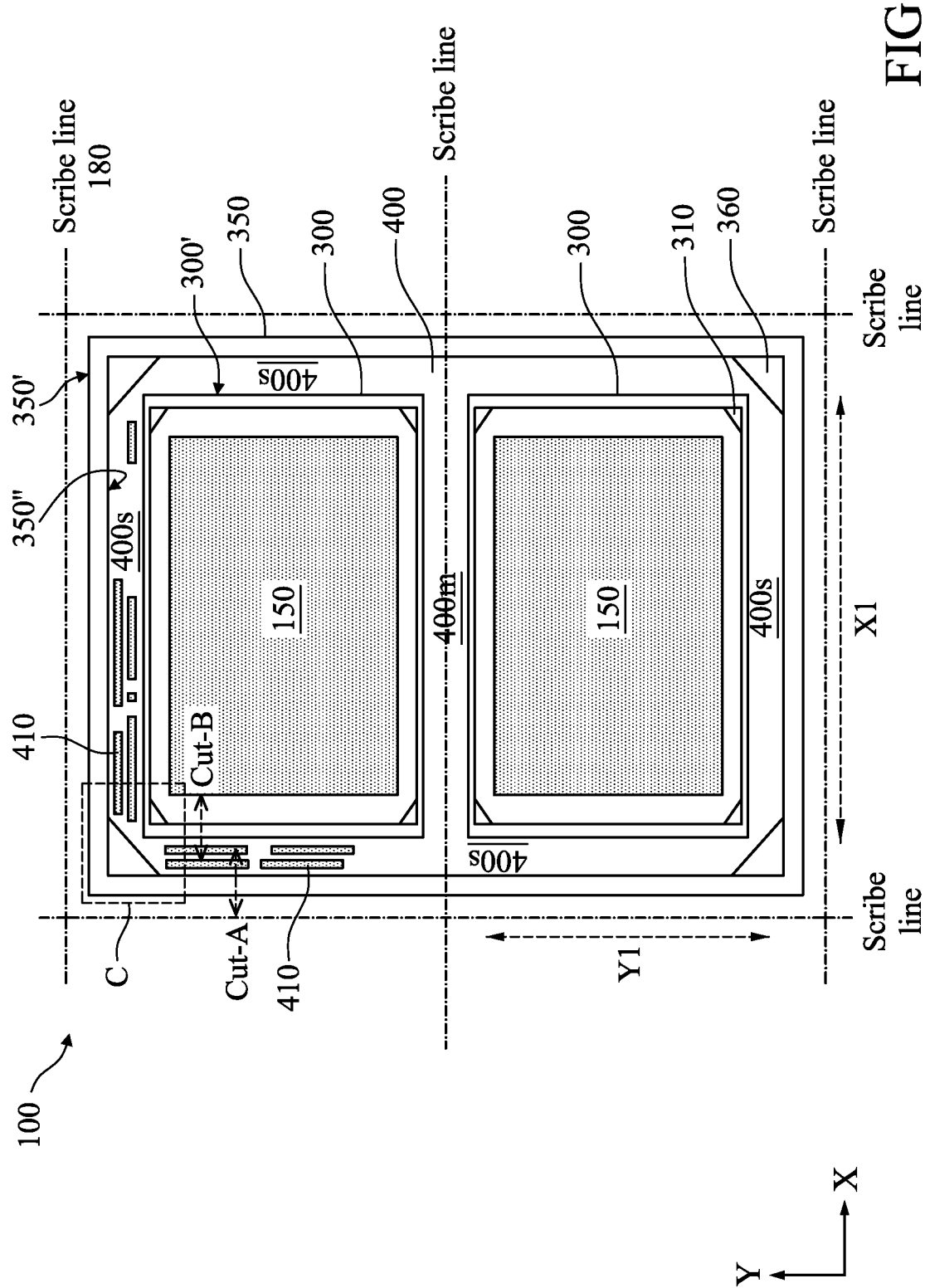
FIG. 1 is a top plan view of a semiconductor structure with multiple circuit regions and multiple seal rings and with functional patterns in redundant regions according to aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term encompasses numbers that are within certain variations (such as +/−10% or other variations) of the number described, in accordance with the knowledge of the skilled in the art in view of the specific technology disclosed herein, unless otherwise specified. For example, the term "about 5 nm" may encompass the dimension range from 4.5 nm to 5.5 nm, 4.0 nm to 5.0 nm, etc.

This application generally relates to semiconductor structures and fabrication processes, and more particularly to providing a seal ring structure that includes dual seal rings or double seal rings. The dual seal rings include an outer seal ring enclosing or surrounding two or more inner seal rings. Each inner seal ring surrounds a circuit region (or an IC area, a chip area, or an IC die). Certain regions of the inner seal rings can be selectively formed to be open or closed depending on chip architecture. For example, two circuit regions may be formed to have interconnects (wafer-level interconnects) between them, thereby resulting in connected dies, or they may be formed as separate, individual dies. In the former situation, the inner seal rings surrounding each circuit region are partially open to allow interconnects to go through. In the latter situation, the inner seal rings surrounding each circuit region are fully closed. In either case, the outer seal ring is fully closed. In the former situation, the wafer is diced (or cut) outside of the outer seal ring, and the outer seal ring provides fully enclosed protection to the connected dies. In the latter situation, the wafer is diced between the inner seal rings, the outer seal ring is also cut, and the inner seal rings provide fully enclosed protection to individual dies.

In an embodiment of the present disclosure, the outer and the inner seal rings have the same shape and the same structure other than that the inner seal rings can be selectively open or closed. Further, each of the inner and the outer seal rings has a rectangular periphery (i.e., their exterior outline is rectangular or substantially rectangular) and four corner seal ring (CSR) structures at the four interior corners of the rectangular periphery. The CSR structures are triangular shaped for various mechanical concerns. The regions between the inner seal rings and the outer seal ring are referred to as redundant regions. Similarly, a redundant region also exists between the inner seal rings.

In some approaches, the outer seal ring is placed next to and abutting the inner seal rings to save chip area. In such approaches, the redundant regions may have a width about 30 µm to 40 µm. Further, in such approaches, no patterns or only dummy patterns are placed in the redundant regions. Dummy patterns do not perform any circuit functions but may be used for improving pattern density uniformity across a wafer.

In an embodiment of the present disclosure, the redundant regions are intentionally made larger by placing the outer seal ring further away from and not abutting the inner seal rings. For example, the width of one or more of the redundant regions may be in a range from smaller than 40 µm to greater than 200 µm, for example, in a range from about 30 µm to about 220 µm such as from about 40 µm to about 200 µm or from about 70 µm to about 200 µm. In some embodiment, the width of one or more of the redundant regions is equal to or greater than the width of a scribe line, which may be in a range from about 60 µm to about 180 µm. Further, functional patterns (for example, test lines and/or other monitoring circuits) are placed in the redundant regions of the present disclosure. The functional patterns are opposite to the dummy patterns as they perform certain functions for manufacturers and/or designers. For example, the functional patterns may be used to monitor passivation cracks, reduce noise for high frequency circuits, extract inductance or capacitance, monitor critical dimensions, monitor overlay margin, measure film thickness, and so on.

The present disclosure may seem counter-intuitive because it seems to take a larger chip area than needed. However, when considered for the overall utilization of the wafer, the present disclosure provides benefits over other approaches. For example, when the redundant region is relatively narrow, such as less than 40 µm, it is limited as to what type pattern(s) can be placed in the redundant region. For example, to accommodate a test line or other testing and/or monitoring circuit, an area of at least about 60 µm to 70 µm wide is needed. Thus, when the redundant region is relatively narrow, it cannot accommodate a test line or other testing and/or monitoring circuit and these type of circuit patterns (or functional patterns) have to be placed in the scribe line regions or inside the inner seal rings. Essentially, certain wafer areas are still used for these patterns in addition to having the redundant regions being empty or having only dummy patterns. Comparatively speaking, embodiments of the present disclosure increase the wafer utilization. Further, depending on how individual dies are exposed on a wafer (for example, using a photolithography stepper), certain scribe line regions may not be available for accommodating any patterns. By using the present disclosure where functional patterns are placed in the redundant regions, the individual dies can be more flexibly exposed, such as a single die per exposure or multiple dies per exposure, without concerns about how to place the functional patterns in the scribe line regions. Those of ordinary skill in the art should appreciate that they may readily use the present disclosure as a basis for designing or modifying other processes and structures for carrying out the same purposes and/or achieving the same advantages of the embodiments introduced herein.

FIG. 1 is a top plan view of a semiconductor structure (or semiconductor device) 100, such as a manufactured wafer or a part thereof, constructed according to an embodiment of the present disclosure. The semiconductor structure 100 includes an outer seal ring 350 that encloses (or surrounds) multiple inner seal rings 300. Each inner seal ring 300 encloses a circuit region (or IC die) 150. The embodiment depicted in FIG. 1 shows two inner seal rings 300 enclosing two circuit regions 150. In other embodiments (not shown), the outer seal ring 350 may enclose more than two inner seal rings 300 and more than two circuit regions 150. In some embodiments, each circuit region 150 may perform the same function. For example, each circuit region 150 may be a memory chip or a processor chip. In some embodiments, the circuit regions 150 may perform different functions. For example, one circuit region 150 may be a transmitter chip (such as a wireless transmitter) and another circuit region 150 may be a receiver chip (such as a wireless receiver). In the embodiment depicted in FIG. 1, each circuit region 150 is produced as an individual die or chip. For example, the semiconductor structure 100 is diced (or cut) along scribe lines 180 as illustrated in FIG. 1. As a result, the outer seal ring 350 is also cut. The inner seal rings 300 stay intact during the dicing process and provide sealing and protective functions to each individual circuit region 150 (also referred to as individual dies 150 for this embodiment).

The outer seal ring 350 has a rectangular or substantially rectangular periphery. In other words, the exterior outline (or exterior periphery) 350' of the outer seal ring 350 is rectangular or substantially rectangular. The outer seal ring 350 further includes four corner seal ring (CSR) structures 360 at the four interior corners of the rectangular or substantially rectangular periphery. In an embodiment, the CSR structure 360 is triangular or substantially triangular. For example, the periphery of each CSR structure 360 is a right triangle or a right isosceles triangle. The legs of the triangle run parallel to the edges of the periphery of the outer seal ring 350, and the hypotenuse of the triangle is adjacent to but not abutting the inner seal rings 300. The CSR structures 360 provide various mechanical benefits to the outer seal ring 350, such as preventing layer peeling at the corner of the chips during dicing processes. With the CSR structures 360, the interior outline (or interior boundary) of the outer seal ring 350 is octagonal or substantially octagonal.

Still referring to FIG. 1, each inner seal ring 300 has the same structure as the outer seal ring 350 in this embodiment. In other words, each inner seal ring 300 has a rectangular or substantially rectangular periphery and has four CSR structures 310 at the four interior corners of the rectangular or substantially rectangular periphery. The interior outline (or interior boundary) of each inner seal ring 300 is octagonal or substantially octagonal. Using the same structure in both the inner seal rings 300 and the outer seal ring 350 advantageously reduces the manufacturer's time spent on qualifying different seal ring structures. In the present embodiment, the inner seal rings 300 are spaced away from the outer seal ring 350 (see also FIGS. 3-6) so that the exterior corners of the inner seal rings 300 are spaced away from the hypotenuse of the CSR structures 360. In some embodiments, the outer seal ring 350 has a horizontal dimension (along the "X" direction) about 26 mm and a vertical dimension (along the "Y" direction) about 33 mm. In an embodiment such as shown in FIG. 1 where two circuit regions 150 are enclosed by the outer seal ring 350, the horizontal dimension X1 of the inner seal ring 300 is in a range of about 10 mm to 26 mm and the vertical dimension Y1 of the inner seal ring 300 is in a range of about 10 mm to about 16 mm. In an alternative embodiment (for example, where more than two circuit regions 150 are enclosed in the outer seal ring 350), the dimensions X1 and Y1 may be different from the above ranges.

The semiconductor structure 100 further includes redundant regions 400s between the outer seal ring 350 and the inner seal rings 300. In embodiments, the width (d2x and d2y as shown in FIGS. 3-6) of the redundant regions 400s are in a range of about 30 µm to about 200 µm and at least one of the redundant regions 400s has a width in a range of about 60 µm to about 200 µm, such as from about 80 µm to about 200 µm, for example, to accommodate multiple functional patterns 410 therein.

The semiconductor structure 100 further includes functional patterns 410 in redundant regions 400s. For purposes of simplicity, only some functional patterns 410 are shown in the top left area of the semiconductor structure 100. In various embodiments, the functional patterns 410 may be placed in any one of or all of the redundant regions 400s. In some embodiments, at least one of the redundant regions 400s includes multiple (such as three or more) functional patterns 410 arranged across the width of the respective redundant regions 400s.

Figure 2:
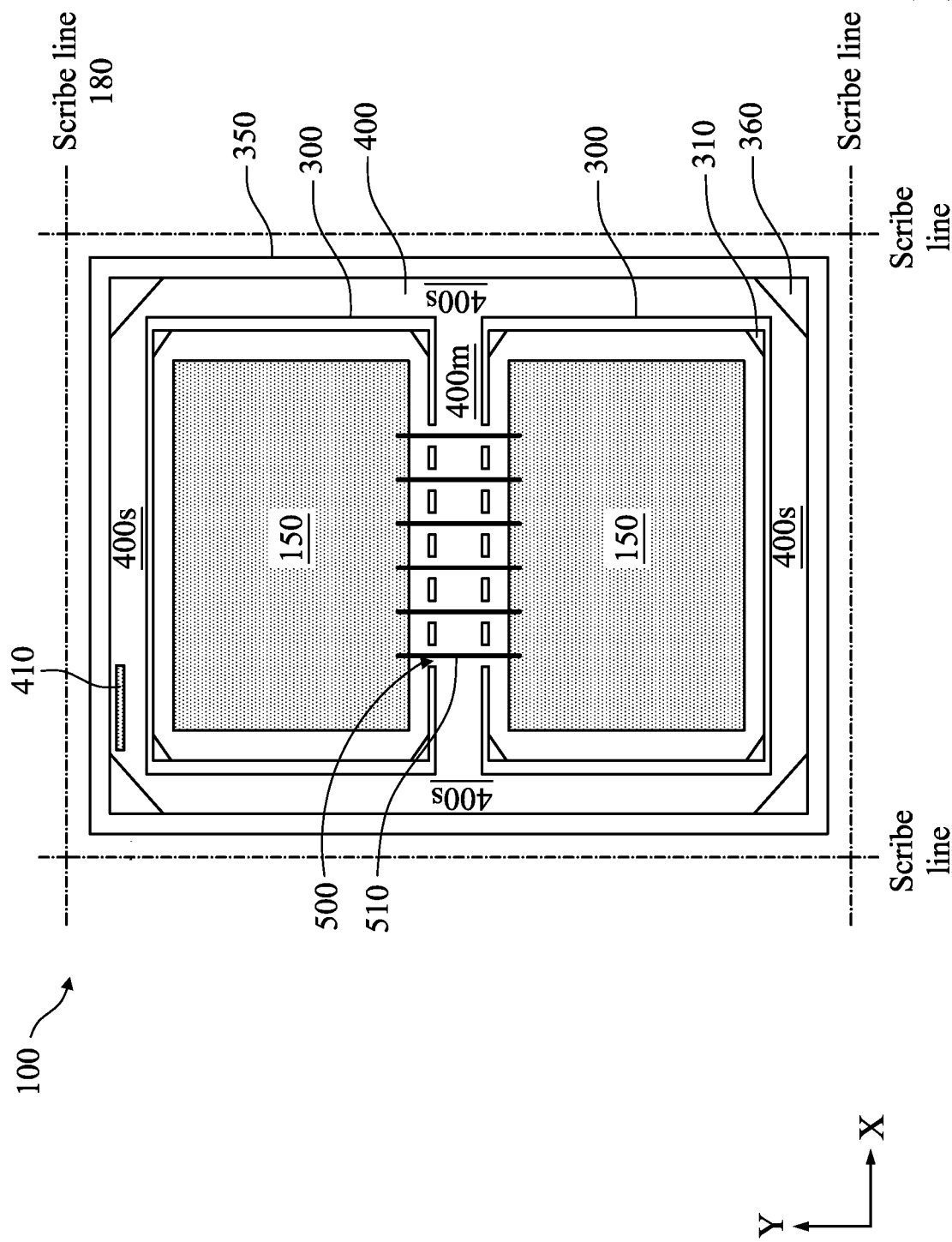
FIG. 2 is a top plan view of a semiconductor structure where inner seal rings are selectively opened, and interconnects are selectively formed between circuit regions according to aspects of the present disclosure.

Furthermore, the region between the inner seal rings 300 is a redundant region 400m in some embodiments (such as the embodiment of FIG. 1), while part of it becomes a circuit region in an alternative embodiment (such as the embodiment of FIG. 2). The redundant region 400m is rectangular or substantially rectangular in an embodiment. In an embodiment, the redundant region 400m has a width (along "Y" direction) of about 60 µm to about 200 µm (such as about 65 µm to about 180 µm) and a length (along "X" direction) of about 1 mm to about 26 mm. In the following discussion, both the redundant regions 400s and the redundant region 400m are referred to as redundant regions 400. In some embodiments, functional patterns 410 are placed in both redundant regions 400s and redundant region 400m. In some embodiments, functional patterns 410 are placed in the redundant regions 400s only and not in the redundant region 400m.

In an embodiment, the functional patterns 410 include patterns that perform certain monitoring, testing, and/or circuit functions such as a test line, a passivation crack monitor circuit, a low noise seal ring pattern, an inductance monitor, a capacitance monitor, a resistance monitor, an inline critical dimension (CD) monitor, an overlay monitor, a film thickness monitor, multiple instances of the above, or a combination of the above. These types of functional patterns are at least 40 µm wide in some embodiments of the present disclosure.

Test lines (also referred to as testlines or test keys) are often included in scribe line regions. In the present embodiment, test lines are included in the redundant regions 400 as functional patterns 410 in addition to or alternative to test lines included in the scribe line regions. Each test line may include a plurality of testing devices that are formed in the same way as how the circuit regions 150 are formed. By studying parametric test results in the testing devices, it is possible to detect IC manufacturing errors and monitor the performance of various stages of the IC manufacturing process. For example, a testing device may include one or more circuit elements, either passive or active, or a combination thereof, such as a transistor (e.g., field-effect transistor FET or bipolar junction transistor BJT), a resistor, a capacitor, an inductor, a contact, a via, an electrical fuse (e-fuse), a memory cell, etc. The test line may further include testing pads and other circuitry for conducting the tests through the testing devices.

A passivation crack monitor circuit is a very thin pattern that is used to monitor whether the dicing process (or die sawing process) causes cracks in the inner seal ring 300 and the circuit region 150. For example, when dicing along the scribe lines 180, the passivation layer (a layer above the upper metal layer) may crack due to mechanical stress. The passivation crack monitor circuit can be used to monitor such crack(s). Based on the monitored results, manufacturer may decide whether the circuit region is good for next fabrication stage such as further testing and/or packaging. In some approaches, a passivation crack monitor circuit is placed in the scribe line regions. However, placing it in the redundant region 400s makes it closer to the circuit region 150, thereby making the monitored results more accurate.

Figure 6:
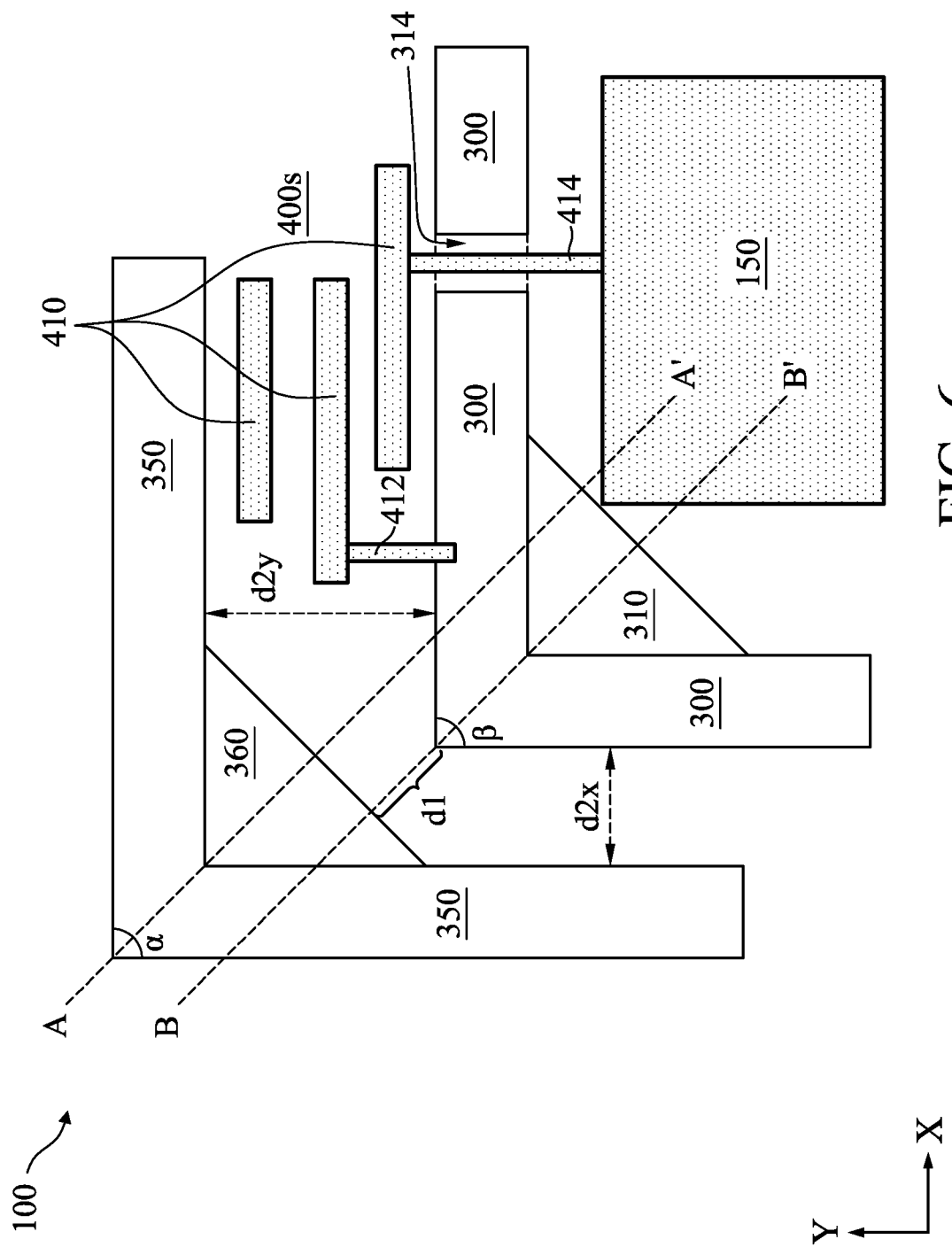

A low noise seal ring pattern can be used to channel noise out of the circuit regions 150. For example, in some designs, the circuit region 150 may include high frequency or ultra-high frequency circuits. This type of circuits may produce noise that affects the operation of other circuits. For another example, the circuit region 150 may include both digital circuits and analog circuits and it is desirable to shield the analog circuits from the switching noise of the digital circuits. In these examples, a low noise seal ring pattern (or simply, a low noise pattern) may be placed in the redundant regions 400s as a functional pattern 410 and is connected to the inner seal ring 300, the circuit region 150, or both. For example, as shown in FIG. 6, a functional pattern 410 is connected to the inner seal ring 300 by a connection 412, and another functional pattern 410 is connected to the circuit region 150 by a connection 414. Either or both functional patterns 410 may be a low noise pattern. The low noise pattern may be further connected to a ground plane to channel high frequency noise from the circuit region 150 to the ground plane, thereby improving the performance of the circuit region 150.

An inductance monitor may be used to monitor the inductance of the circuit region 150. For example, the circuit region 150 may be designed to have inductors. Similar inductors or a portion thereof are also formed in the redundant regions 400 as one or more functional patterns 410. By monitoring the inductance of these functional patterns 410, manufacturer may decide whether the inductor(s) in the circuit region 150 meet the design target.

A capacitance monitor may be used to monitor the capacitance of the circuit region 150. For example, the circuit region 150 may be designed to have capacitors. Similar capacitors or a portion thereof are also formed in the redundant regions 400 as one or more functional patterns 410. By monitoring the capacitance of these functional patterns 410, manufacturer may decide whether the capacitors in the circuit region 150 meet the design target.

A resistance monitor may be used to monitor the resistance of the circuit region 150. For example, the circuit region 150 may be designed to have resistors. Similar resistors or a portion thereof are also formed in the redundant regions 400 as one or more functional patterns 410. By monitoring the resistance of these functional patterns 410, manufacturer may decide whether the resistors in the circuit region 150 meet the design target.

An inline critical dimension (CD) monitor may be used to monitor the CD of circuit patterns in the circuit region 150. For example, a CD monitor may be formed as a functional pattern 410, at least one dimension of which is designed to match a critical dimension of the circuit patterns in the circuit region 150. By measuring the dimension of the CD monitor during manufacturing processes (an inline measurement), manufacturer may learn whether the circuit patterns in the circuit region 150 have been fabricated within specification.

An overlay monitor may be used to monitor the overlay errors or overlay margin between two vertically stacked layers in the circuit region 150. For example, an overlay monitor may be formed as multiple functional patterns 410 vertically stacked (along the Z direction, see FIG. 7) in the redundant regions 400. By measuring the amount of overlay between these functional patterns 410, manufacturer may learn whether the overlay between vertically stacked layers in the circuit region 150 have been fabricated within specification.

A film thickness monitor may be used to monitor the thickness of certain layer(s) (such as a metal layer, an etch stop layer, etc.) in the circuit region 150. For example, a film thickness monitor may be formed as one or more functional patterns 410 in the redundant regions 400. By measuring the thickness of the functional pattern 410 (either inline or offline), manufacturer may learn whether the circuit patterns in the circuit region 150 have been fabricated with satisfactory thickness.

The functional patterns 410 may be of rectangular shapes (including long and/or short rectangles), square shapes, or other shapes and may be formed in any one or more layers that make up the redundant region 400 and the circuit regions 150. For example, the functional patterns 410 may be formed in semiconductor layer(s), diffusion layer(s), fin layer(s), gate layer(s), contact layer(s), insulating layer(s), via layer(s), and metal layer(s). As discussed earlier, by having the functional patterns 410 in the redundant regions 400, the wafer is more fully utilized. Furthermore, having the functional patterns 410 in the redundant regions 400 also increases the pattern density uniformity for the benefits of various processes such as photolithography and chemical mechanical planarization (CMP).

FIG. 2 is a variant of the embodiment shown in FIG. 1 where inner seal rings 300 are formed with openings 500 at selective locations and interconnects 510 (which are conductors) are formed to connect multiple circuit regions 150 through the openings 500. The interconnects 510 are wafer-level (or die-level) interconnects, which advantageously reduce resistance and improve noise immunity over some off-chip interconnects. The interconnected circuit regions 150 (also referred to as connected dies 150 for this embodiment) form a larger system (or a system-on-wafer). In such embodiments, the semiconductor structure 100 is diced (or cut) along scribe lines 180 that are outside of the outer seal ring 350 as shown in FIG. 2. Thus, the outer seal ring 350 provides sealing and protective functions to the connected dies 150. In the embodiment depicted in FIG. 2, functional patterns 410 may be formed in the redundant regions 400s and/or 400m, similar to the embodiment in FIG. 1. For simplicity, only one functional pattern 410 is shown in FIG. 2.

In an embodiment, the set of masks (referred to as mask set A) that are used to form the semiconductor structure 100 shown in FIG. 1 and the set of masks (referred to as mask set B) that are used to form the semiconductor structure 100 shown in FIG. 2 share some common masks. A mask is also referred to as a photo mask or photomask and is used to perform photolithography on semiconductor wafers to form features of the semiconductor structure 100. For example, mask set A and mask set B may share common masks for some of the diffusion layer, fin layer (for FinFETs or gate-all-around transistors), gate layer, contact layer, via layers, and metal layers. The fin layer refers to a semiconductor layer where semiconductor fins for FinFETs or gate-all-around transistors are formed protruding over a semiconductor substrate (such as a silicon substrate). The mask set A and the mask set B differ in those layers where the interconnects 510 are formed, such as some metal layers, particularly high-level metal layers, such as the fifth metal (M5) layer, the sixth metal (M6) layer, and/or other metal layers. By sharing masks between the mask set A and the mask set B, a manufacturer can selectively produce individual dies 150, connected dies 150, or both, with reduced total costs. For example, if each of the mask set A and the mask set B has N masks, the manufacturer may just need to produce M common masks, $N_1$ masks specifically for the mask set A, and $N_2$ masks specifically for the mask set B, where $M+N_1+N_2$ is less than 2N. The less number of masks produced, the less costs to the manufacturer. The individual dies 150 and the connected dies 150 may satisfy different market demands.

Figure 3:
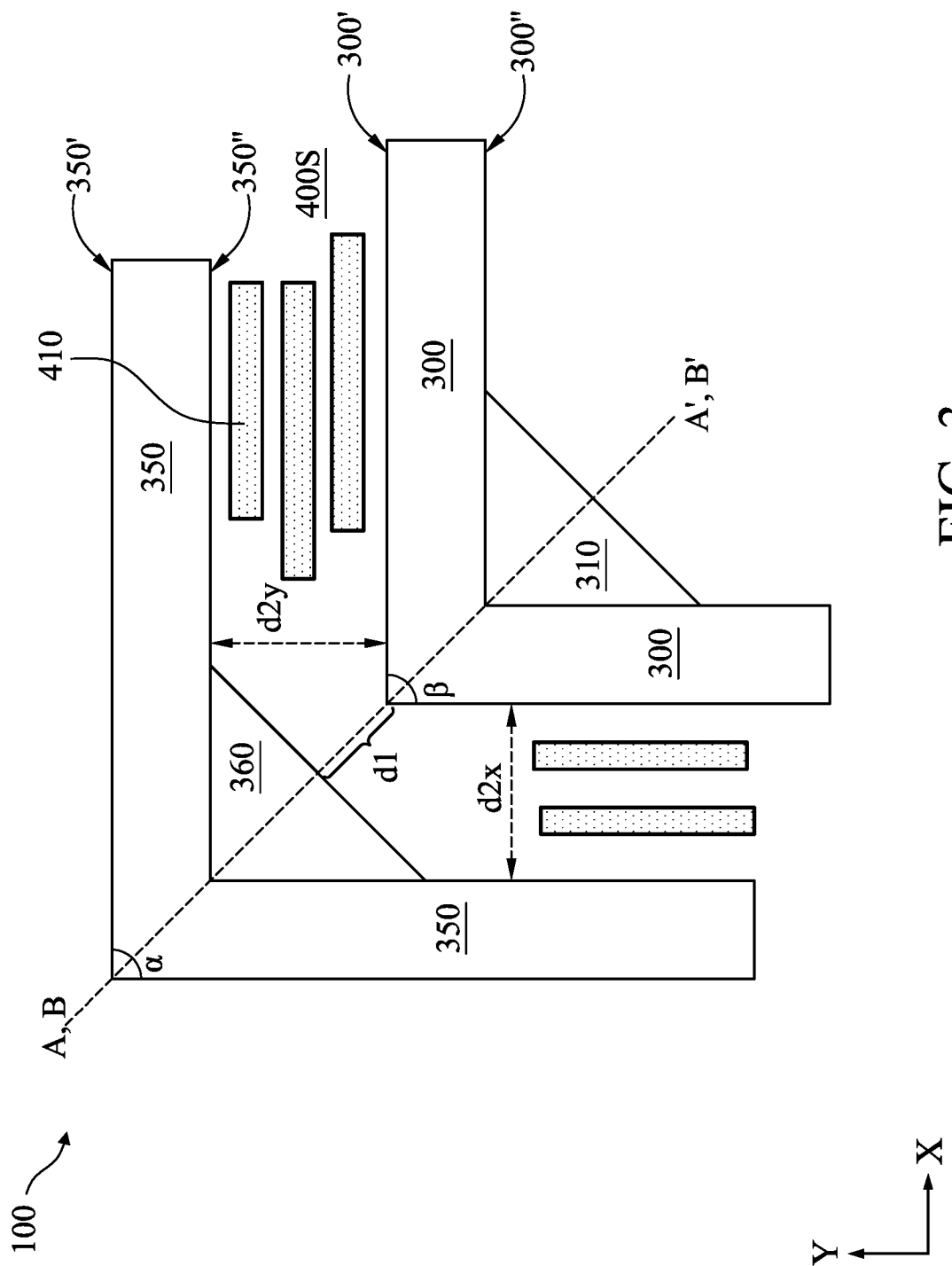
FIGS. 3, 4, 5, and 6 are closeup top plan views of the semiconductor structure shown in the area C in FIG. 1 according to embodiments of the present disclosure.

FIG. 3 is a closeup top plan view of the semiconductor structure 100 shown in the area C in FIG. 1 according to an embodiment of the present disclosure. In FIG. 3, the line A-A' denotes the bisector of an interior angle α of a corner of the outer seal ring 350, and the line B-B' denotes the bisector of an interior angle β of a corner of the inner seal ring 300. The two corners are adjacent to each other, thus are referred to as adjacent corners. Since both the outer seal ring 350 and the inner seal rings 300 are substantially rectangular in this embodiment, there are four sets of such adjacent corners and each of the angles α and β is 90° or substantially 90°. In this embodiment, the line A-A' is the same as the line B-B'. In other words, a common line bisects the interior angle α and the interior angle β. The inner seal ring 300 is spaced away from the outer seal ring 350. Particularly, the exterior corner of the inner seal ring 300 is spaced away from the hypotenuse of the CSR structure 360 of the outer seal ring 350 by a distance d1 along the line B-B'. In an embodiment, the distance d1 is greater than 0 μm, such as in a range from about 1 μm to about 240 μm. In an alternative embodiment, the distance d1 is greater than 240 μm. Still further, the exterior sides 300' of the inner seal ring 300 are spaced away from the interior sides 350" of the outer seal ring 350 by a distance d2x along the "X" direction and by a distance d2y along the "Y" direction. In the embodiment of FIG. 3, the distance d2x equals to the distance d2y and each of them is designed to be large enough to accommodate multiple (such as three or more) functional patterns 410 placed along the respective direction X or Y. For example, each of d2x and d2y may be in a range of 30 μm to 200 μm, such as from 40 μm to 200 μm or from 80 μm to 200 μm.

Figure 4:
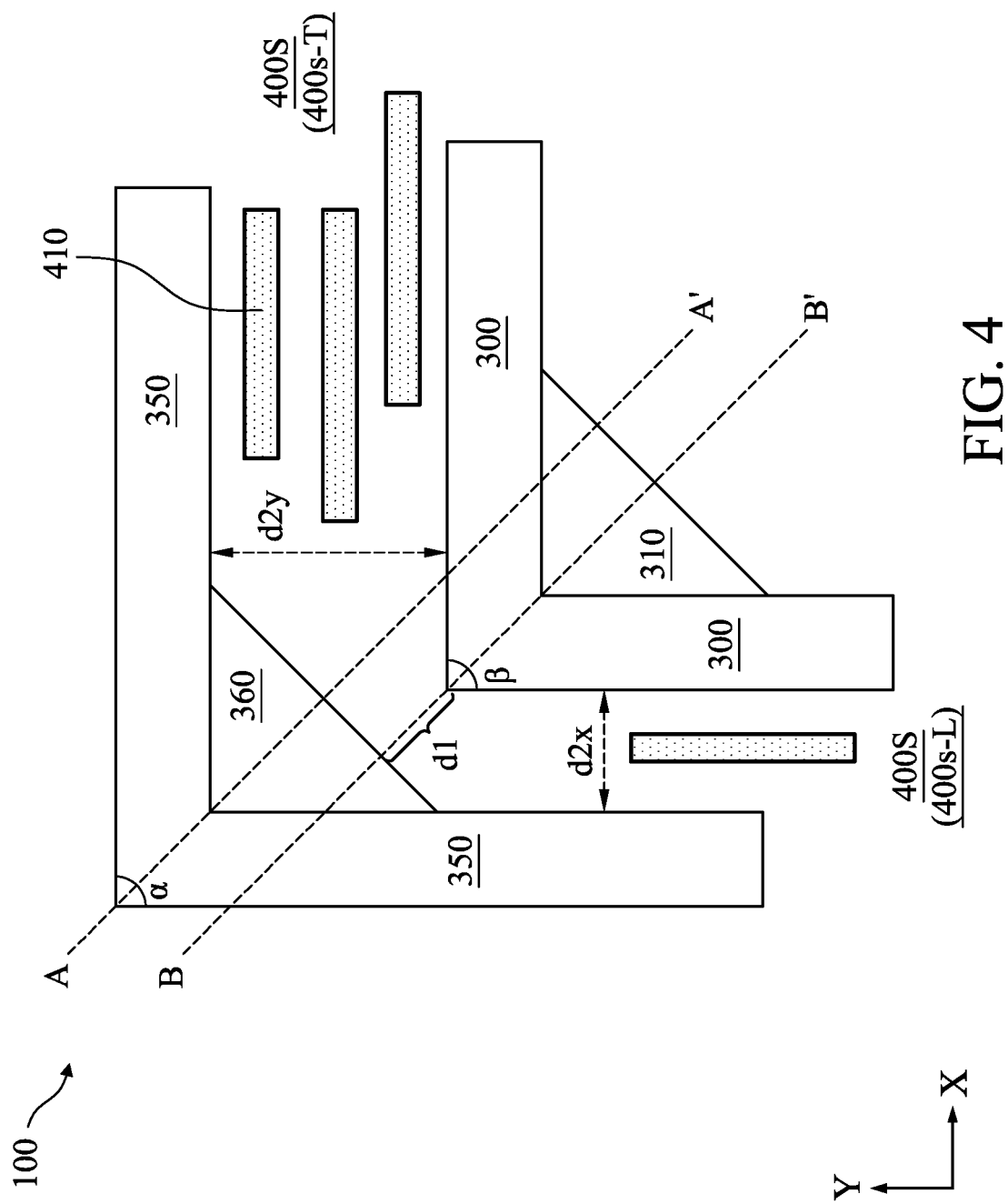

FIG. 4 is a closeup top plan view of the semiconductor structure 100 shown in the area C in FIG. 1 according to another embodiment of the present disclosure. In FIG. 4, the line A-A' still denotes the bisector of the interior angle α, and the line B-B' still denotes the bisector of the interior angle β. The line B-B' is parallel to and spaced away from the line A-A'. Compared with the embodiment in FIG. 3, the inner seal ring 300 in the embodiment in FIG. 4 is shifted lower and to the left. This creates more space in the redundant region 400s above the inner seal ring 300 (labeled as 400s-T) but reduces space in the redundant region 400s to the left (along the "X" direction) of the inner seal ring 300 (labeled as 400s-L). One benefit of this embodiment is that the redundant region 400s-T can accommodate large functional patterns 410 that would otherwise be difficult or impossible to fit into the redundant region 400s. In this embodiment, the distance d2y is greater than the distance d2x, for example, by 10 μm or more. The distance d2y may be designed based on layout usage. The inner seal ring 300 is spaced away from the outer seal ring 350. Particularly, the exterior corner of the inner seal ring 300 is spaced away from the hypotenuse of the CSR structure 360 of the outer seal ring 350 by a distance d1 along the line B-B'. In an embodiment, the distance d1 is in a range from 0 μm to about 240 µm. In some embodiment, the distance d1 is 0 µm, i.e., the inner seal ring 300 abuts or touches the CSR structure 360.

Figure 5:
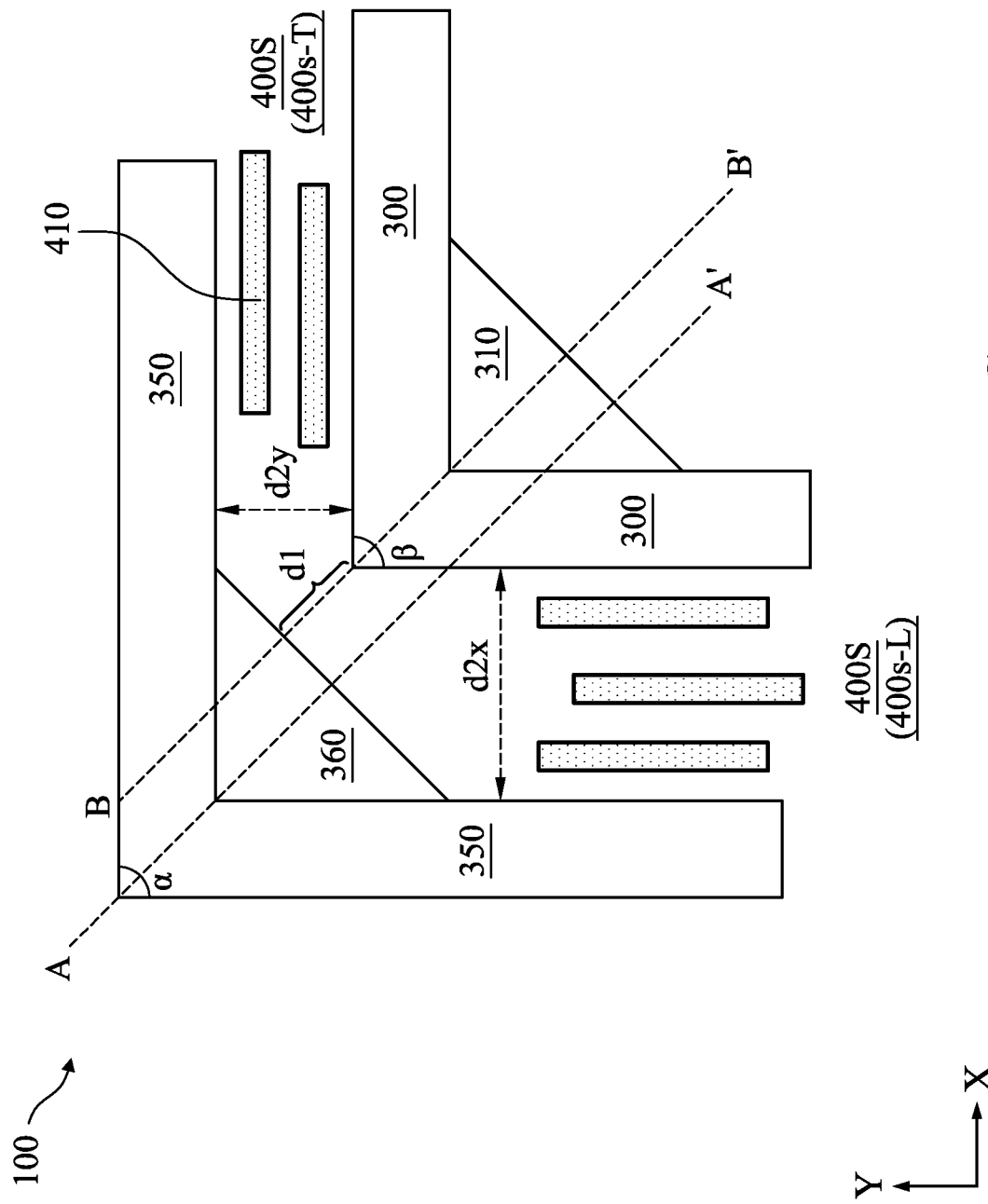

FIG. 5 is a closeup top plan view of the semiconductor structure 100 shown in the area C in FIG. 1 according to yet another embodiment of the present disclosure. In FIG. 5, the line A-A' still denotes the bisector of the interior angle α, and the line B-B' still denotes the bisector of the interior angle β. The line B-B' is parallel to and spaced away from the line A-A'. Compared with the embodiment in FIG. 3, the inner seal ring 300 in the embodiment in FIG. 5 is shifted higher and to the right. This creates more space in the redundant region 400s-L but reduces space in the redundant region 400s-T. One benefit of this embodiment is that the redundant region 400s-L can accommodate large functional patterns 410 that would otherwise be difficult or impossible to fit into the redundant region 400s. In this embodiment, the distance d2x is greater than the distance d2y, for example, by 10 µm or more. The distance d2x may be designed based on layout usage. The inner seal ring 300 is spaced away from the outer seal ring 350. Particularly, the exterior corner of the inner seal ring 300 is spaced away from the hypotenuse of the CSR structure 360 of the outer seal ring 350 by a distance d1 along the line B-B'. In an embodiment, the distance d1 is in a range from 0 µm to about 240 µm. In some embodiment, the distance d1 is 0 µm, i.e., the inner seal ring 300 abuts or touches the CSR structure 360.

FIG. 6 illustrates an embodiment whether some functional patterns 410 are electrically connected to the inner seal ring 300 or the circuit region 150. For example, a functional pattern 410 is electrically connected to the inner seal ring 300 by a connection 412, and another functional pattern 410 is electrically connected to the circuit region 150 by a connection 414 that goes through an opening 314 in the inner seal ring 300. Such functional patterns 410 and connections 412, 414 may be implemented in any of the embodiments discussed above, including the embodiments shown in FIGS. 1-5. The connections 412 and 414 may be implemented in any suitable layer(s) of the semiconductor structure 100, such as diffusion layers, gate layers, contact layers, or metal layers.

Figure 7:
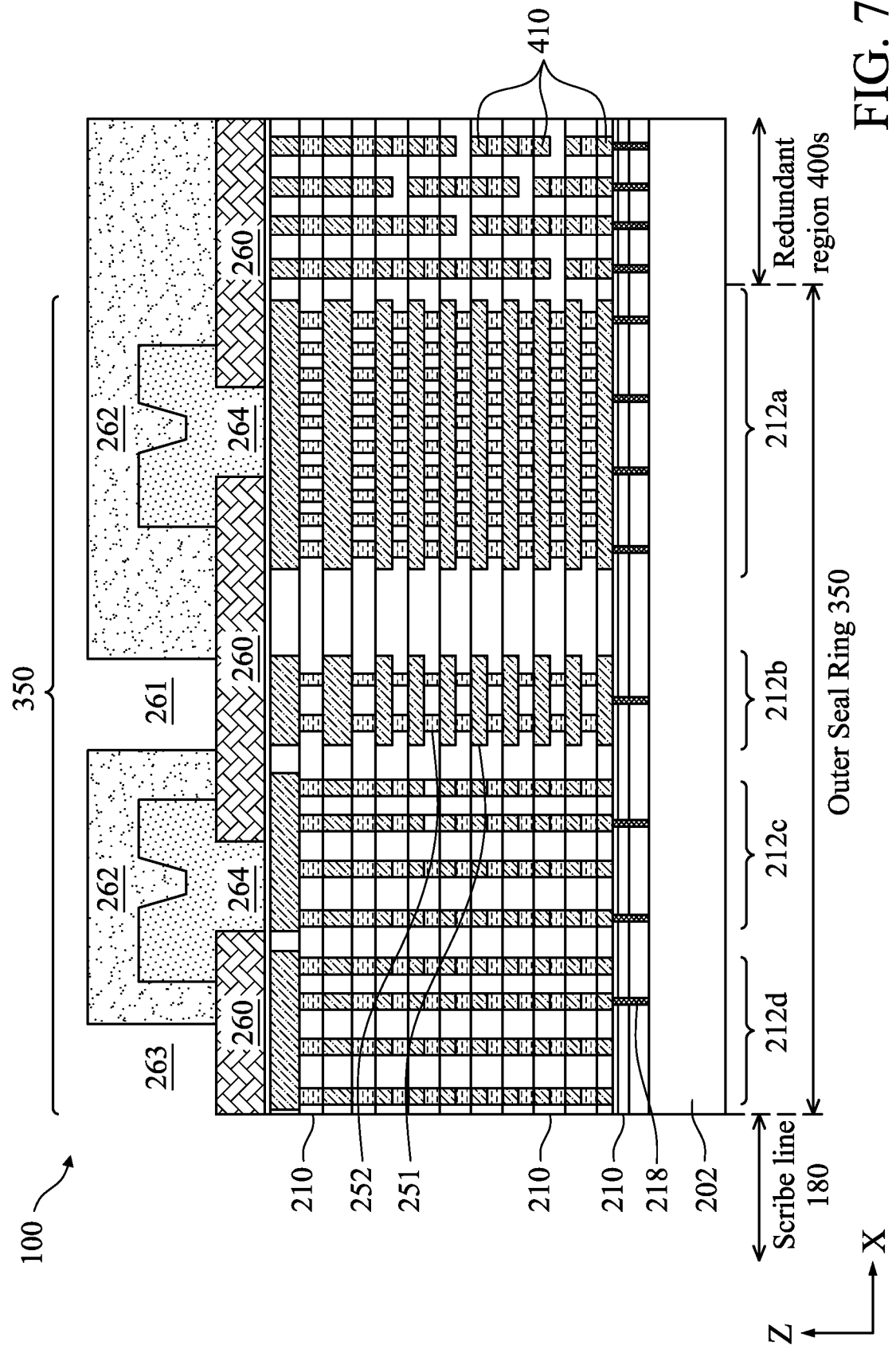
FIG. 7 is a cross-sectional view of a portion of the semiconductor structure shown in FIG. 1 along the "Cut-A" line of FIG. 1, according to various aspects of the present disclosure.

FIG. 7 shows a cross-sectional view of a portion of the semiconductor structure 100 along the "Cut-A" line of FIG. 1, according to various aspects of the present disclosure. Referring to FIG. 7, the outer seal ring 350 includes multiple sub seal rings such as sub seal rings 212a, 212b, 212c, and 212d, which will be further discussed below. Further, the functional patterns 410 are present in the redundant region 400s. The functional patterns 410 at different layers of the semiconductor structure 100 may or may not be connected depending on their designed functionality.

Referring to FIG. 7, the semiconductor structure 100 includes a substrate 202. The substrate 202 is a silicon substrate in the present embodiment. The substrate 202 may alternatively include other semiconductor materials in various embodiment, such as germanium, silicon carbide, gallium arsenide, gallium phosphide, indium phosphide, indium arsenide, indium antimonide, SiGe, GaAsP, AlInAs, AlGaAs, GaInAs, GaInP, GaInAsP, or combinations thereof. The substrate 202 may include doped active regions such as a P-well and/or an N-well 204 (see FIG. 9). The substrate 202 may also further include other features such as a buried layer, and/or an epitaxy layer. Furthermore, the substrate 202 may be a semiconductor on insulator such as silicon on insulator (SOI). In other embodiments, the substrate 202 may include a doped epitaxy layer, a gradient semiconductor layer, and/or may further include a semiconductor layer overlying another semiconductor layer of a different type such as a silicon layer on a silicon germanium layer. The substrate 202 includes active regions (such as $N^+$ or $P^+$ doped regions) that are configured as an NMOS device (e.g., nFET) or a PMOS device (e.g., pFET). The substrate 202 may include underlying layers, devices, junctions, and other features (not shown). The outer seal ring 350, the inner seal rings 300, the functional patterns 410, and the circuit regions 150 are built in or on the substrate 202. The substrate 202 further includes an assembly isolation 170 (FIG. 8) between the inner seal rings 300 and the circuit regions 150 and scribe line regions (for scribe lines 180) surrounding the outer seal ring 350 and optionally going through the outer seal ring 350.

The outer seal ring 350 includes the sub seal rings 212a, 212b, 212c, and 212d. The sub seal ring 212a is wider than the other sub seal rings, thus may be referred to as the main sub seal ring. Having multiple nested sub seal rings ensures that at least the inner sub seal ring(s) is/are protected from cracks during dicing (e.g., die sawing). For example, the sub seal rings 212c and 212d can protect the sub seal rings 212a and 212b from damages that may occur during dicing.

Each of the sub seal rings 212a, 212b, 212c, and 212d includes one or more conductive features 218 disposed on the substrate 202, such as disposed on active regions of the substrate 202. The conductive features 218 may include multiple conductors vertically stacked, and may include doped semiconductors, metals, conductive nitride, conductive oxide, or other types of conductive materials. Over the conductive features 218, each of the sub seal rings 212a, 212b, 212c, and 212d further includes multiple metal layers 251 stacked one over another and vertically connected by metal vias 252. Metal layers 251 and metal vias 252 may comprise copper, copper alloys, or other conductive materials and may be formed using single damascene or dual damascene processes. Each of the metal layers 251 and the metal vias 252 may include a conductive barrier layer (such as TiN or TaN) surrounding a metal core (such as copper). In an embodiment, each of the metal layers 251 is formed into a ring or a ring-like structure (such as a substantially square ring) that surrounds the inner seal rings 300 and the circuit regions 150. In other words, each of the metal layers 251 is formed into a closed structure and extends along the edges of the area occupied by the inner seal rings 300 and the circuit regions 150. In the present embodiment, a ring or a ring-like structure refers to a closed structure, which may be rectangular, square, substantially rectangular, substantially square, or in other polygonal shapes. In an embodiment, the outer vias 252 (the vias 252 that are the closest and the furthest, respectively, from the inner seal rings 300 and the circuit regions 150) are formed into the shape of a ring. Thus, they are also referred to as via bars. The inner vias 252 are formed into discrete vias along a line parallel to the outer vias 252. In the present embodiment, each of the sub seal rings 212a and 212c further includes an aluminum pad 264.

The conductive features 218, the metal layers 251, and the metal vias 252 are embedded in dielectric layers 210. The dielectric layers 210 may include silicon oxide, silicon nitride, silicon oxynitride, low-k dielectric materials, extreme low-k (ELK) dielectric materials, or other suitable dielectric materials (for example, including silicon, oxygen, nitrogen, carbon, or other suitable isolation constituent), or combinations thereof. The semiconductor structure 100 further includes a passivation layer 260 over the dielectric layers 210 and another passivation layer 262 over the passivation layer 260. Each of the aluminum pads 264 includes a top portion that is disposed over the passivation layer 260 and a bottom portion that penetrates the passivation layer 260 and electrically connects to the sub seal rings 212a and 212c. In an embodiment, each of the aluminum pads 264 is formed into a shape of a ring that surrounds the inner seal rings 300 and the circuit regions 150. Thus, the aluminum pads 264 may also be referred to as aluminum rings 264. Aluminum pads 264 may be formed simultaneously with the formation of bond pads (not shown) that are exposed on the top surface of circuit regions 150. The passivation layer 262 is disposed over the passivation layer 260 and the aluminum pads 264. Passivation layers 260 and 262 may be formed of oxides, nitrides, and combinations thereof, and may be formed of the same or different materials.

A trench 261 is provided in the passivation layer 262 above the sub seal ring 212b. Another trench 263 is provided in the passivation layer 262 above the sub seal ring 212d. In an embodiment, each of the trenches 261 and 263 is formed into a shape of a ring surrounding the inner seal rings 300 and the circuit regions 150. An advantageous feature of the dual trenches 261, 263 is that if a crack occurs in the scribe line during dicing, the crack will be stopped by the trench 263. Even if the crack propagates across the trench 263, if at all, the stress of the crack is substantially reduced by the trench 261. As discussed above, one of the functionalities of the functional patterns 410 is to monitor such crack. The semiconductor structure 100 may include other features and layers not shown in FIG. 7.

As shown in FIG. 7, the functional patterns 410 may include features in various layers such as diffusion layers, gate layers, contact layers, metal layers, via layers, and insulating layers depending on the functionality of the functional patterns 410. For example, some functional patterns 410 may include transistors, conductors, and/or insulators.

Figure 8:
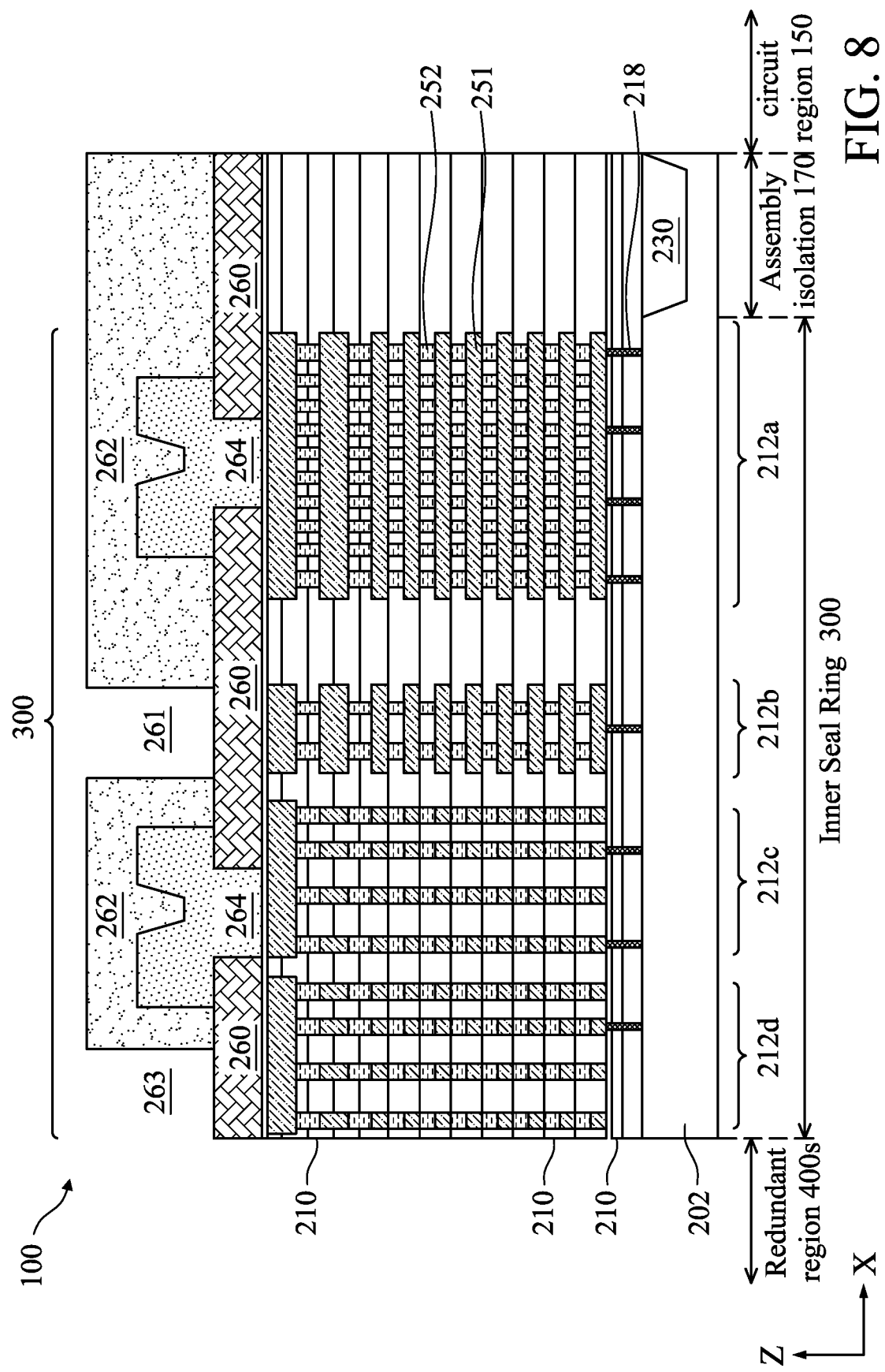
FIG. 8 is a cross-sectional view of a portion of the semiconductor structure shown in FIG. 1 along the "Cut-B" line of FIG. 1, according to various aspects of the present disclosure.

FIG. 8 shows a cross-sectional view of a portion of the semiconductor structure 100 along the "Cut-B" line of FIG. 1 according to various aspects of the present disclosure. Referring to FIG. 8, similar to the outer seal ring 350, the inner seal ring 300 also includes multiple sub seal rings such as sub seal rings 212a, 212b, 212c, and 212d. The features of the inner seal ring 300 are the same as those of the outer seal ring 350, except that, for example, the dimensions of the sub seal rings may be different between them.

The semiconductor structure 100 further includes an assembly isolation 170 between the inner seal ring 300 and the circuit region 150. The assembly isolation 170 includes an isolation structure (such as shallow trench isolation) 230. The isolation structure 230 may include silicon oxide, silicon nitride, silicon oxynitride, other suitable isolation material (for example, including silicon, oxygen, nitrogen, carbon, or other suitable isolation constituent), or combinations thereof. Isolation structure 230 can include different structures, such as shallow trench isolation (STI) structures and/or deep trench isolation (DTI) structures. In some embodiments, the semiconductor structure 100 may include various dummy lines and dummy vias in the assembly isolation 170.

Figure 9:
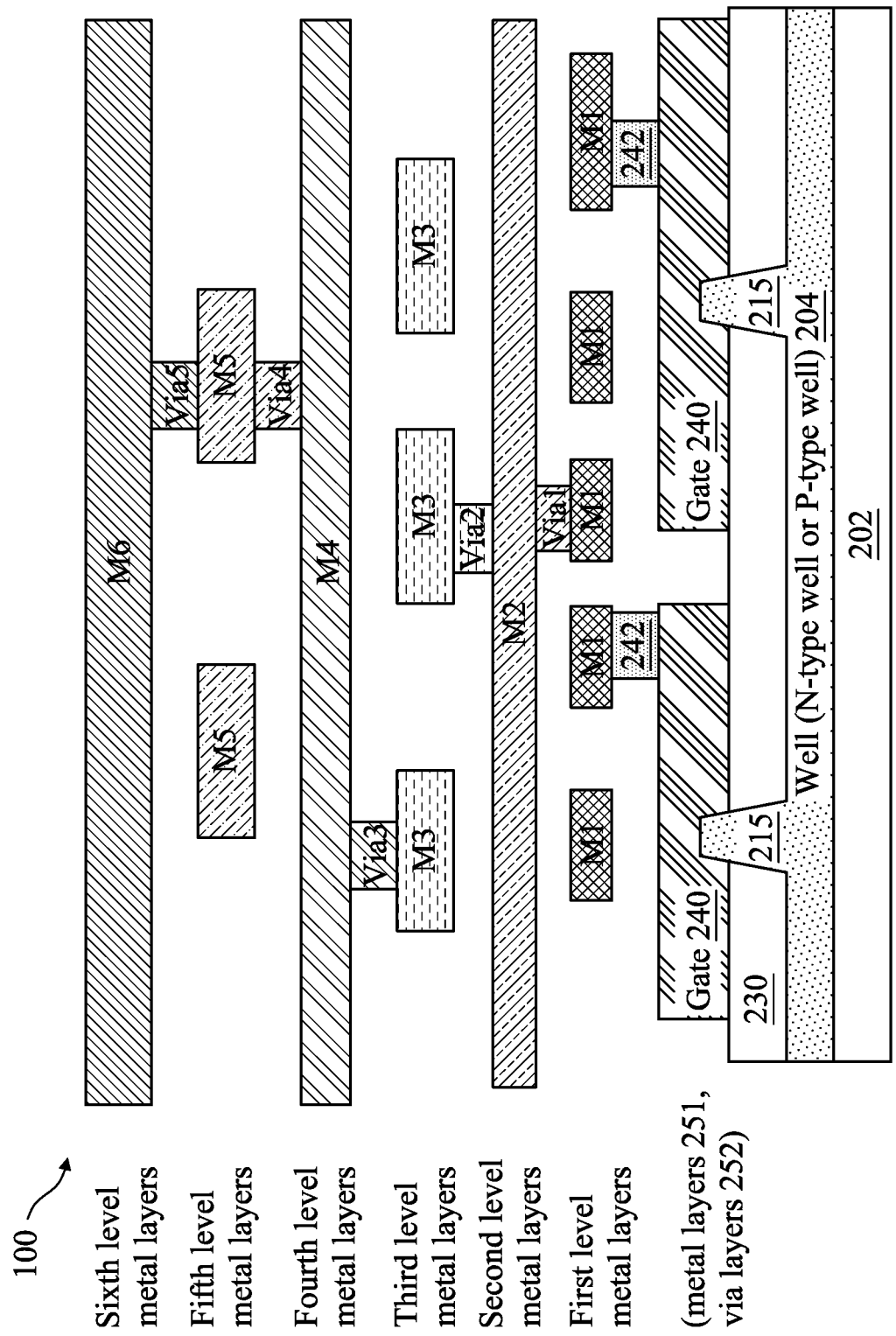
FIG. 9 shows a cross-sectional view of various layers of the semiconductor structure shown in FIG. 1, according to an embodiment of the present disclosure.

FIG. 9 shows a cross-sectional view of the semiconductor structure 100, illustrating various layers therein including wells (or diffusion layer) 204, isolation structure 230, fin layer 215, gate layer 240, gate via layer 242, contact layer (not shown, but at the same level as the gate layer 240), via0 layer (not shown, but at the same level as the gate via layer 242), the first through sixth metal (M1, M2, M3, M4, M5, and M6) layers 251, and the first through fifth via (via1, via2, via3, via4, and via5) layers 252. The semiconductor structure 100 may include other layers or features not shown in FIG. 9.

The wells 204 are formed in or on the substrate 202 in the circuit regions 150, and in some embodiment also in the redundant regions 400s for certain functional patterns 410. The wells 204 include p-type doped regions configured for n-type transistors, and n-type doped regions configured for p-type transistors. The fin layer 215 includes fin-shaped semiconductor material(s) (or fins) protruding from the substrate 202. In an embodiment, the fins for NMOSFET include single crystalline silicon or intrinsic silicon or another suitable semiconductor material; and the fins for PMOSFET may comprise silicon, germanium, silicon germanium, or another suitable semiconductor material. In an embodiment, functional patterns 410 are also formed in the fin layer, in the form of semiconductor fins. The isolation structure 230 has been discussed earlier and isolates the fins.

The gate layer 240 includes gate structures having gate dielectric layer(s) and gate electrode layer(s). The gate dielectric layer(s) may include silicon dioxide, silicon oxynitride, and/or a high-k dielectric material such as $HfO_2$, $HfSiO$, $HfSiO_4$, $HfSiON$, $HfLaO$, $HfTaO$, $HfTiO$, $HfZrO$, $HfAlO_x$, $ZrO$, $ZrO_2$, $ZrSiO_2$, $AlO$, $AlSiO$, $Al_2O_3$, $TiO$, $TiO_2$, $LaO$, $LaSiO$, $Ta_2O_3$, $Ta_2O_5$, $Y_2O_3$, $SrTiO_3$, $BaZrO$, $BaTiO_3$ (BTO), $(Ba,Sr)TiO_3$ (BST), $Si_3N_4$, hafnium dioxide-alumina ($HfO_2$—$Al_2O_3$) alloy, other suitable high-k dielectric material, or combinations thereof. High-k dielectric material generally refers to dielectric materials having a high dielectric constant, for example, greater than that of silicon oxide (k≈3.9). The gate electrode layer(s) may include titanium, aluminum, tantalum carbide, tantalum carbide nitride, tantalum silicon nitride, titanium nitride, tantalum nitride, ruthenium, molybdenum, tungsten, platinum, tungsten, cobalt, copper, and/or other suitable materials. In an embodiment, functional patterns 410 are also formed in the gate layer, in the form of gate dielectric layer(s) and gate electrode layer(s).

Each of the gate via layer 242, contact layer (not shown), via0 layer (not shown), the via layers 252, and the metal layers 251 may include titanium, tantalum, tungsten, cobalt, molybdenum, ruthenium, or a conductive nitride such as titanium nitride, titanium aluminum nitride, tungsten nitride, tantalum nitride, or combinations thereof, and may be formed by CVD, PVD, ALD, and/or other suitable processes. In an embodiment, functional patterns 410 are also formed in one or more of the layers mentioned above and using the same material and process that form the corresponding features in the circuit regions 150.

Although not intended to be limiting, embodiments of the present disclosure provide one or more of the following advantages. For example, embodiments of the present disclosure provide a semiconductor structure with a dual seal ring structure. The dual seal ring structure includes an outer seal ring enclosing two or more inner seal rings. Each inner seal ring encloses a circuit region. The semiconductor structure can be used to form connected dies or individual dies flexibly. Redundant regions between the outer seal ring and the inner seal rings are provided with functional patterns to further utilize the wafer area. The functional patterns may perform various monitoring, testing, or other functions. Embodiments of the present disclosure can be readily integrated into existing semiconductor manufacturing processes.

In one example aspect, the present disclosure is directed to a semiconductor structure. The semiconductor structure includes a first circuit region; a first inner seal ring at least partially surrounding the first circuit region; and an outer seal ring at least partially surrounding the first inner seal ring. The outer seal ring includes a first corner and a substantially triangular corner seal ring (CSR) structure at the first corner. The first inner seal ring includes a second corner adjacent to and spaced away from the CSR structure. The semiconductor structure further includes a first region between a first side of the first corner and a first side of the second corner that is parallel to the first side of the first corner, and multiple functional patterns in the first region.

In an embodiment of the semiconductor structure, a common line bisects an interior angle of the first corner and an interior angle of the second corner. In another embodiment, a bisector of an interior angle of the first corner and a bisector of an interior angle of the second corner are parallel to each other and spaced away from each other. In a further embodiment, the semiconductor structure further includes a second region between a second side of the first corner and a second side of the second corner that is parallel to the second side of the first corner, wherein a first distance between the first side of the first corner and the first side of the second corner is greater than a second distance between the second side of the first corner and the second side of the second corner.

In an embodiment of the semiconductor structure, a width of the first region as measured along a direction that is perpendicular to the first side of the first corner is in a range from about 30 μm to about 200 μm. In an embodiment, the functional patterns include one or more test lines. In another embodiment, the functional patterns include a passivation crack monitor circuit, a low noise seal ring pattern, an inductance monitor, a capacitance monitor, a resistance monitor, an inline critical dimension monitor, an overlay monitor, a film thickness monitor, or a combination thereof.

In an embodiment of the semiconductor structure, at least one of the functional patterns is electrically connected to the first circuit region. In another embodiment, at least one of the functional patterns is electrically connected to the first inner seal ring. In an embodiment, the semiconductor structure further includes a second circuit region; a second inner seal ring at least partially surrounding the second circuit region; and interconnects that go through the first and the second inner seal rings and electrically connect the first and the second circuit regions, wherein the outer seal ring surrounds the first and the second circuit regions, the first and the second inner seal rings, and the interconnects.

In another example aspect, the present disclosure is directed to a semiconductor structure. The semiconductor structure includes first and second circuit regions and first and second inner seal rings at least partially surrounding the first and the second circuit regions, respectively, and spaced out by a first region. The semiconductor structure further includes openings in the first and the second inner seal rings; interconnects in the first region and going through the openings and electrically connecting the first and the second circuit regions; an outer seal ring surrounding the first and the second inner seal rings and the first region; a second region that is inside the outer seal ring and outside of the first and the second inner seal rings and is different from the first region; and multiple functional patterns in the second region.

In an embodiment of the semiconductor structure, the functional patterns include one or more test lines, a passivation crack monitor circuit, a low noise seal ring pattern, an inductance monitor, a capacitance monitor, a resistance monitor, an inline critical dimension monitor, an overlay monitor, a film thickness monitor, or a combination thereof.

In an embodiment, at least one of the functional patterns is electrically connected to the first circuit region. In another embodiment, at least one of the functional patterns is electrically connected to the first inner seal ring. In another embodiment, the second region has a length in a range from about 10 mm to about 26 mm and a width in a range from about 30 μm to about 200 μm. In yet another embodiment, the outer seal ring includes a first corner, the first inner seal ring includes a second corner adjacent to the first corner and spaced away from the outer seal ring, a bisector of an interior angle of the first corner and another bisector of an interior angle of the second corner are parallel to each other and spaced away from each other.

In yet another example aspect, the present disclosure is directed to a semiconductor structure that includes first and second circuit regions; first and second inner seal rings at least partially surrounding the first and the second circuit regions, respectively; and an outer seal ring surrounding the first and the second inner seal rings, thereby defining multiple substantially rectangular regions between the outer seal ring and the first and the second inner seal rings. The semiconductor structure further includes functional patterns in at least one of the substantially rectangular regions, wherein the functional patterns include one or more test lines, a passivation crack monitor circuit, a low noise seal ring pattern, an inductance monitor, a capacitance monitor, a resistance monitor, an inline critical dimension monitor, an overlay monitor, a film thickness monitor, or a combination thereof.

In an embodiment of the semiconductor structure, at least one of the functional patterns is electrically connected to the first circuit region. In another embodiment, at least one of the functional patterns is electrically connected to the first inner seal ring. In yet another embodiment, the outer seal ring includes a first corner, the first inner seal ring includes a second corner adjacent to the first corner and spaced away from the outer seal ring, a bisector of an interior angle of the first corner and a bisector of an interior angle of the second corner are parallel to each other and spaced away from each other.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor structure, comprising:
a first circuit region;
a first inner seal ring at least partially surrounding the first circuit region;
an outer seal ring at least partially surrounding the first inner seal ring, wherein the outer seal ring includes a first corner area and a substantially triangular corner seal ring (CSR) structure at the first corner area, wherein the first inner seal ring includes a second corner area adjacent to and spaced away from the CSR structure;

a first region between a first side of the first corner area and a first side of the second corner area that is parallel to the first side of the first corner area;

a second region between a second side of the first corner area and a second side of the second corner area that is parallel to the second side of the first corner area, wherein a first shortest distance between the first side of the first corner area and the first side of the second corner area is greater than a second shortest distance between the second side of the first corner area and the second side of the second corner area; and multiple functional patterns in the first region.

2. The semiconductor structure of claim 1, wherein a common line bisects an interior angle of the first corner area and an interior angle of the second corner area.

3. The semiconductor structure of claim 1, wherein a bisector of an interior angle of the first corner area and a bisector of an interior angle of the second corner area are parallel to each other and spaced away from each other.

4. The semiconductor structure of claim 1, wherein the first shortest distance is in a range from about 30 µm to about 200 µm.

5. The semiconductor structure of claim 1, wherein the functional patterns include at least an inductance monitor.

6. The semiconductor structure of claim 1, wherein the functional patterns include a passivation crack monitor circuit, a low noise seal ring pattern, an inline critical dimension monitor, an overlay monitor, a film thickness monitor, or a combination thereof.

7. The semiconductor structure of claim 1, wherein at least one of the functional patterns is electrically connected to the first circuit region.

8. The semiconductor structure of claim 1, wherein at least one of the functional patterns is electrically connected to the first inner seal ring.

9. The semiconductor structure of claim 1, further comprising:
   a second circuit region;
   a second inner seal ring at least partially surrounding the second circuit region; and
   interconnects that go through the first and the second inner seal rings and electrically connect the first and the second circuit regions,
   wherein the outer seal ring surrounds the first and the second circuit regions, the first and the second inner seal rings, and the interconnects.

10. The semiconductor structure of claim 1, wherein a distance between the first inner seal ring and the CSR structure is in a range from about 1 µm to about 240 µm.

11. A semiconductor structure, comprising:
   first and second circuit regions;
   first and second inner seal rings at least partially surrounding the first and the second circuit regions, respectively, and spaced out by a first region;
   openings in the first and the second inner seal rings;
   interconnects in the first region and going through the openings and electrically connecting the first and the second circuit regions;
   an outer seal ring surrounding the first and the second inner seal rings and the first region;
   a second region that is inside the outer seal ring and outside of the first and the second inner seal rings and is different from the first region; and
   multiple functional patterns in the second region, wherein at least one of the functional patterns is electrically connected to the first circuit region.

12. The semiconductor structure of claim 11, wherein the functional patterns include one or more passivation crack monitor circuit, a low noise seal ring pattern, an inductance monitor, an inline critical dimension monitor, an overlay monitor, a film thickness monitor, or a combination thereof.

13. The semiconductor structure of claim 11, wherein at least one of the functional patterns is electrically connected to the first inner seal ring.

14. The semiconductor structure of claim 11, wherein the second region has a length in a range from about 10 mm to about 26 mm and a width in a range from about 30 µm to about 200 µm.

15. The semiconductor structure of claim 11, wherein the outer seal ring includes a first corner, the first inner seal ring includes a second corner adjacent to the first corner and spaced away from the outer seal ring, a bisector of an interior angle of the first corner and another bisector of an interior angle of the second corner are parallel to each other and spaced away from each other.

16. A semiconductor structure, comprising:
   first and second circuit regions;
   first and second inner seal rings at least partially surrounding the first and the second circuit regions, respectively;
   an outer seal ring surrounding the first and the second inner seal rings, thereby defining multiple elongated regions between the outer seal ring and the first and the second inner seal rings; and
   functional patterns in at least one of the elongated regions, wherein the functional patterns include one of a passivation crack monitor circuit, a low noise seal ring pattern, an inductance monitor, an inline critical dimension monitor, an overlay monitor, a film thickness monitor, or a combination thereof, wherein at least one of the functional patterns is electrically connected to the first circuit region.

17. The semiconductor structure of claim 16, wherein at least one of the functional patterns is electrically connected to the first inner seal ring.

18. The semiconductor structure of claim 16, wherein the outer seal ring includes a first corner, the first inner seal ring includes a second corner adjacent to the first corner and spaced away from the outer seal ring, a bisector of an interior angle of the first corner and a bisector of an interior angle of the second corner are parallel to each other and spaced away from each other.

19. The semiconductor structure of claim 16, wherein:
   the outer seal ring includes a first side and a second side intersecting at a first corner,
   the first inner seal ring includes a first side and a second side intersecting at a second corner,
   the first side of the outer seal ring is parallel to the first side of the first inner seal ring,
   the second side of the outer seal ring is parallel to the second side of the first inner seal ring, and
   a first shortest distance between the first side of the outer seal ring and the first side of the first inner seal ring is greater than a second shortest distance between the second side of the outer seal ring and the second side of the first inner seal ring.

20. The semiconductor structure of claim 16, wherein the multiple elongated regions include:
   a first region defined by an area between a first side of the inner seal ring and a first side of the outer seal ring parallel to the first side of the inner seal ring; and
   a second region defined by an area between a second side of the inner seal ring perpendicular to the first side of the inner seal ring and a second side of the outer seal ring parallel to the second side of the inner seal ring, wherein the second region includes more functional patterns than the first region.

* * * * *